United States Patent

Hartman

[15] 3,640,399

[45] Feb. 8, 1972

[54] PRINTED CIRCUIT CARD RACK

[72] Inventor: John H. Hartman, Bedford, Tex.

[73] Assignee: Thermalloy Incorporated, Dallas, Tex.

[22] Filed: Mar. 12, 1970

[21] Appl. No.: 18,893

[52] U.S. Cl. ....................211/175, 317/117

[51] Int. Cl. ....................A47f 5/10

[58] Field of Search ....................211/175, 41, 101; 317/117, 317/99, 120; 312/107, 108, 321, 257

[56] References Cited

UNITED STATES PATENTS

| | | | |
|---|---|---|---|
| 3,014,594 | 12/1961 | Kerstner | 211/41 |
| 3,016,148 | 1/1962 | Riddle | 211/41 |
| 3,017,232 | 1/1962 | Schwab | 211/41 X |
| 3,196,764 | 7/1965 | Grieder | 94/31 |
| 3,329,473 | 7/1967 | Dickson | 312/108 |
| 3,458,767 | 7/1969 | Hedger | 317/101 |
| 3,470,420 | 9/1969 | Marks | 317/101 |
| 3,511,385 | 5/1970 | Ayling | 211/41 |

*Primary Examiner*—Nile C. Byers, Jr.
*Attorney*—Jack A. Kanz

[57] ABSTRACT

A printed circuit card rack is described having a pair of spaced-apart end assemblies between which a plurality of channel members are connected that support circuit card guides. Connectors are supported by the channel members in alignment with the guides. The end assemblies each comprise a plurality of members that permit selectively changing the distance of separation between selected channel members, so that printed circuit cards of different widths can be accommodated. The end assemblies also include members for attaching the rack to a panel, in which these members are selectively adjustable relative to the other end members, so that printed circuit cards of different depths can be accommodated.

11 Claims, 7 Drawing Figures

INVENTOR
JOHN H. HARTMAN

Jack A Kemp

ATTORNEY

PATENTED FEB 8 1972

3,640,399

INVENTOR
JOHN H. HARTMAN

Jack A Kanz
ATTORNEY

INVENTOR
JOHN H. HARTMAN

Jack A Kanz
ATTORNEY

PATENTED FEB 8 1972 3,640,399

*INVENTOR*

JOHN H. HARTMAN

Jack A Kanz

*ATTORNEY*

PRINTED CIRCUIT CARD RACK

This invention relates to hardware for accommodating electronic equipment, and more particularly to a rack for holding printed circuit cards.

There has been considerable development of hardware for holding printed circuit cards. This hardware is referred to as printed circuit card racks, in which a substantial number of cards can be accommodated in the racks. Thus electronic circuitry is assembled as modular units, so that a printed circuit card can be readily replaced with an identical card if it fails. These racks are all characterized by suitable guide elements between which the cards are supported, and a connector into which the card is plugged. The guide elements provide the additional function of accurately guiding the card into the connector when it is inserted in the rack. All of the available racks will also accommodate a plurality of printed circuit cards arranged in parallel.

The available card racks are each characterized by different features, in which all represent attempts for most efficiently accommodating circuit cards. However, all of these racks are characterized by one or more disadvantages. For example, the dimensions of the available racks cannot be readily varied to accommodate a wide range of sizes of printed circuit cards. More precisely, the constructions of these racks are such that the dimensions cannot be readily changed to accommodate changes in the dimensions of circuit cards along both the length and width thereof. In addition, many of these racks are complex in construction and costly to manufacture.

Accordingly, an object of this invention is to provide a printed circuit card rack that is economical to manufacture, and which is adapted to accommodate a wide range of sizes of circuit cards. To accomplish this, the rack of the invention comprises a pair of spaced-apart end assemblies between which a plurality of channel members are connected that support circuit card guides. Connectors are supported by the channel members in alignment with the guides, so that the circuit cards are plugged into the connector when it is inserted into the guides. Each end assembly comprises a pair of members that are adjustably coupled together in which the relative position therebetween is selectively variable, thereby permitting selective variation of the distance of separation between the channel members. This, then, allows the accommodation of circuit cards of varying sizes. The end assemblies also include members for attaching the rack to a panel, in which these members are also selectively adjustable relative to the other end members, so that printed circuit cards of different depths can be accommodated.

Many other objects, features and advantages of the invention will become readily apparent from the following detailed description of a preferred embodiment thereof when taken in conjunction with the appended claims and the attached drawing, wherein like reference numerals refer to like parts throughout the several figures, and in which:

Figures 1, 6:
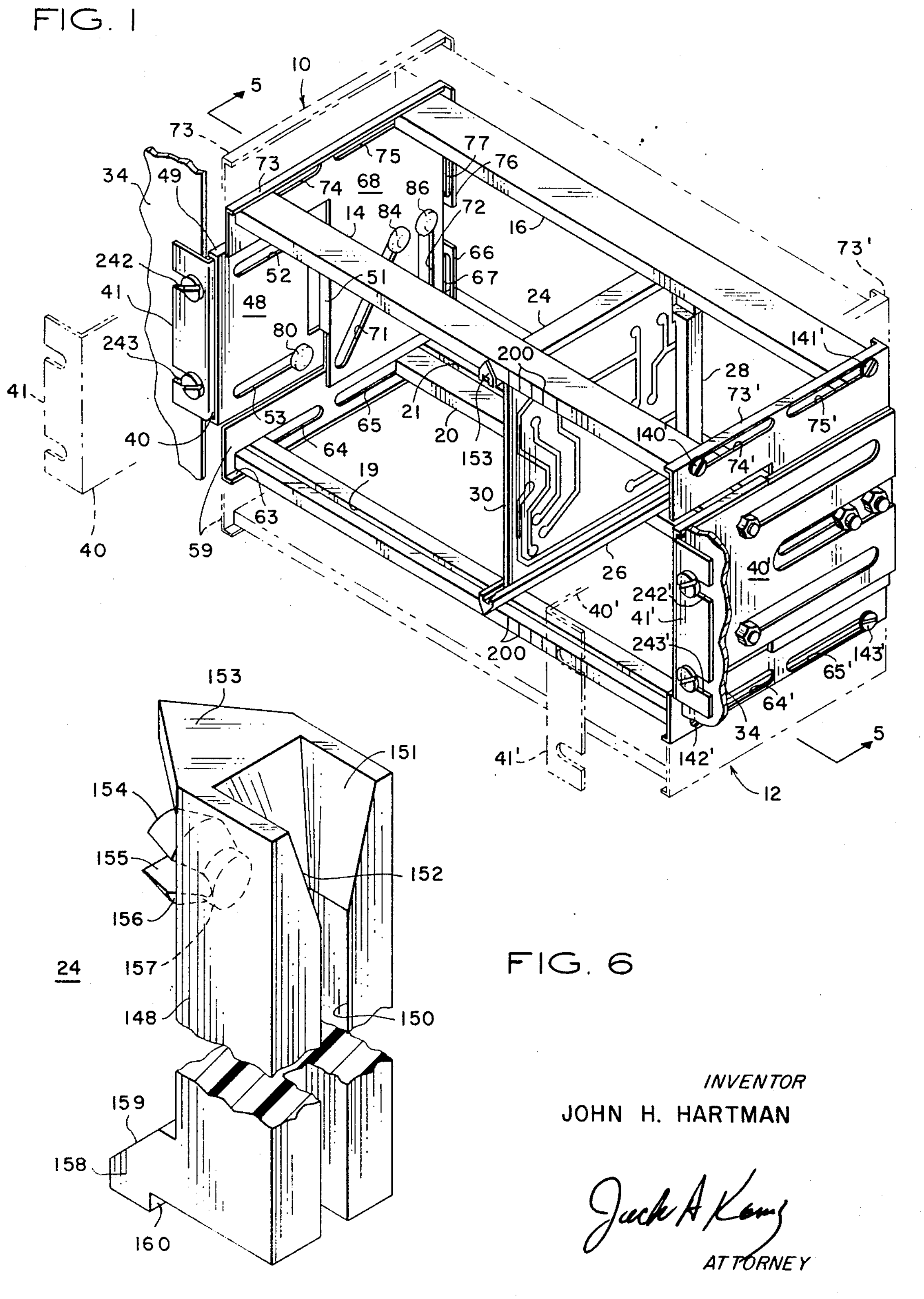
FIG. 1 is a perspective view of a preferred embodiment of the invention.
FIG. 6 is a perspective view, partly broken away, of a card guide used with the rack.

The rack of the invention, as shown in the perspective view of FIG. 1, comprises first and second spaced-apart end assemblies 10 and 12 that are connected together by lateral channels or channel members 14, 16, 18 and 20. The channel members have channels running the length thereof that open to the inside of the rack into which card guides or slides are keyed and held. For example, channel members 18 and 20 include channels 19 and 21, respectively.

A pair of card guides are employed to hold each printed circuit card to be held within the rack. One such printed circuit card 30 is shown supported within the rack by means of card guides 24 and 26, and connector 28. Card guide 24 is held by channel members 14 and 16 in the manner to be described hereinafter, and similarly, card guide 26 is supported from channel members 18 and 20. Additional channel members (shown and described hereinafter in conjunction with FIGS. 5 and 7) hold connector 28 in alignment with the grooves within the card guides. Thus the printed circuit card 30 can be inserted from the front of the rack into the channels or slots in the card guides so that it exactly mates with the connector. It will be understood that the printed circuit card includes a male connector portion for being connected to the female connector portion 28.

The rack is adapted to be secured to a panel 34, in which the panel has an opening equal to the width of the card rack into which the rack is inserted. The rack is secured to the panel by means of bracket members 41 and 41' constituting component parts of end assemblies 10 and 12, respectively. Suitable fastening means, such as screws 242 and 243, and 242' and 243', for example, are used to secure the brackets to the panel.

As will be seen more clearly hereinafter, the bracket members 41 and 41' can be extended forwardly with respect to the remainder of the rack, or the end assemblies, so that the rear portion of the rack is more rearwardly disposed from the panel. In this manner, longer printed circuit cards can be accommodated by the rack. These brackets are fragmentarily shown in phantom in such an extended position. In such case, the longer printed circuit card would extend forward of channel members 24 and 18 with the forward edge thereof terminating behind panel 34.

The end assemblies also comprise other component parts so that channel members 14 and 16 can be separated further from channel members 18 and 20. In this manner, wider printed circuit cards can be accommodated by the rack. The rack as evidenced in this manner, is shown fragmentarily, in phantom, and will be discussed further hereinafter. In addition, it will be apparent that the length of the channel members can be selected as desired, so as many printed circuit cards can be accommodated between the two end assemblies as desired. Thus the dimensions of the card rack can be selectively changed to accommodate a greater number of printed circuit cards, or wider and/or longer printed circuit cards.

Figures 2, 3:
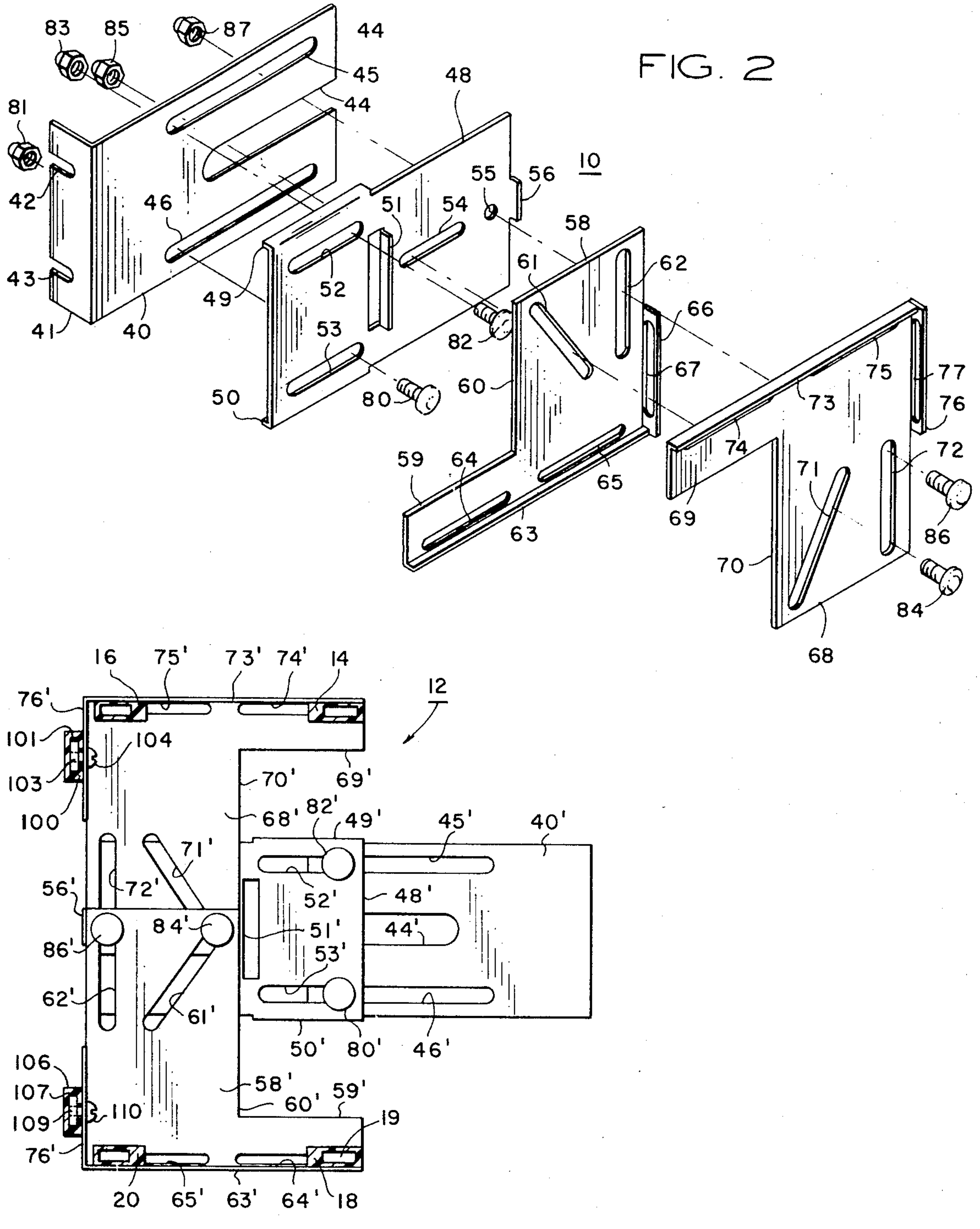
FIG. 2 is an expanded, perspective view of one of the end assemblies of the rack shown in FIG. 1.
FIG. 3 is a view of the end assembly of FIG. 2, looking from within the rack.

First end assembly 10 is shown in the expanded, perspective view of FIG. 2, wherein it should be understood that second end assembly 12 is constructed in a similar manner but is the mirror image of end assembly 10. Accordingly, the like parts of assembly 12 are designated by the same numerals but with a prime notation therewith.

This assembly includes a bracket member 40 having a right-angled bracket or flange 41 with suitable slots 42 and 43 therein. Screws or other fastening means are inserted through these slots to secure the rack to a panel. Member 40 is elongated and includes another open-ended slot 44 in the opposite end thereof, generally disposed along the centerline of the member, and a pair of elongated slots 45 and 46 on either side of slot 44.

The end assembly includes another member 48 which will sometimes be referred to hereinafter as the stationary member. This member is generally rectangular in shape and includes a pair of flanges or brackets 49 and 50 along forward portions of the two edges thereof. These flanges project in the direction of member 40 and fit about the side edges of this member. Thus the flanges 49 and 50 form a channel within which member 40 can be moved back and forth. Another flange 51 is provided in member 48 perpendicular to the previously mentioned flanges and projecting oppositely thereto, and constitutes a surface along which additional members, to be described hereinafter, ride. A pair of spaced-apart, parallel slots 52 and 53 are provided in the front portion of member 48 and which are perpendicular to flange 51. Another slot 54 is provided rearward of the flange 51 and is parallel to slots 52 and 53. A bolthole 55 is provided rearward of slot 54 in alignment therewith, and another flange 56 is provided on the rear edge of the member and extends in the same direction as does flange 51.

A first L-shaped member 58 is employed that includes a forwardly extending portion 59 and an upwardly extending portion 60 integral therewith. Portion 60 includes an angled slot 61 (the slot lying along a line that is at an angle to the other slots previously described), and another slot 62 perpendicular to slot 44 in member 40. Portions 59 and 60 include a flange 63 extending along the edge thereof projecting in the same direction as flanges 51 and 56, with portion 59 including a slot 64 adjacent and parallel to flange 63. The rearward edge of portion 60 includes another flange 66 perpendicular to flange 63 but projecting in the same direction thereof, with a slot 67 being provided in this flange and extending parallel therewith.

A second L-shaped member 68 is employed that includes a forward portion 69 and a downward portion 70. The downward portion 70 includes a slot 71 disposed at an angle to slot 54 but generally opposite to the angle of slot 61. The exact angles of slots 61 and 71 are not critical. However, if slot 61 is along a line that makes an angle of 45° to slot 54, for example, then slot 71 would also be along a line making an angle of 45° with slot 54 but being disposed at an angle of 90° with respect to slot 61. On the other hand, if slot 61 makes an angle of 30° with respect to slot 54, slot 71 would also make an angle of 30° with respect to slot 54 but would be disposed at an angle of 60° with respect to slot 61. Thus slots 61 and 72 make angles of the same magnitude with respect to slot 54, but in opposite senses. Member 68 also includes another slot 72 extending parallel to slot 62 of member 58. A flange 73 is provided along portions 69 and 70 parallel with flange 63 and projecting in the same direction thereof. Portion 69 includes a slot 74 adjacent to flange 73 and parallel therewith, and portion 70 includes another slot 75 adjacent flange 73 and parallel therewith. Another flange 76 is provided on the rear edge of portion 70 and includes another slot 77 parallel to slot 67. It will be apparent from the foregoing that member 68 is substantially a reversed and inverted mirror image of member 58.

As described above, the preferred embodiment of the card rack of the invention may comprise a first end assembly 10 which includes first and second members 58 and 68 adjustably coupled together and a second end assembly 12 which includes third and fourth members 58' and 68' adjustably coupled together. The end assemblies are interconnected by fifth and sixth spaced-apart channel members 14 and 19, respectively. Since fifth member 14 is attached to the first and third members 58 and 58', and sixth member 19 is attached to the second and fourth members 68 and 68'; the distance between the fifth and sixth members is varied with the relative positions of the first and third members and the second and fourth members, respectively. Seventh and eighth members 41 and 41' are adjustably attached to end assemblies 10 and 12 to provide means for attaching the card rack assembly to a panel.

Figure 4:
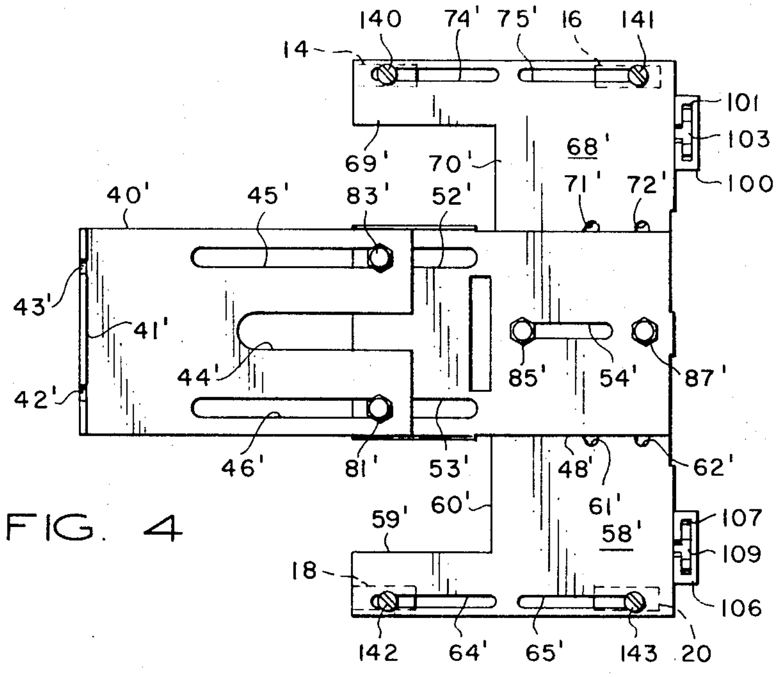
FIG. 4 is a view of the end assembly of FIG. 2, looking from the opposite direction.

Referring to FIGS. 3 and 4 in conjunction with FIG. 2, the assembly and operation of the end assembly will be discussed. Member 48' is positioned against member 40' with flanges 49' and 50' fitting along the side edges thereof. The slots are so cut that slots 52' and 53' are aligned with slots 45' and 46', respectively. Similarly, slot 54' is aligned with open ended slot 44'. A suitable bolt 80' is inserted through slots 53' and 46' and secured in place by a nut 81'. Similarly, a bolt 82' is inserted through slots 52' and 45' and secured by means of nut 83'. It will be apparent that the forward or rearward position of member 40' can be selectively varied relative to member 48' by loosening nuts 81' and 83' and sliding member 40' relative to member 48' between flanges 49' and 50'. Member 40' is shown in a forwardly extending position relative to member 48' in both FIGS. 3 and 4, wherein member 40' can be secured in this position by tightening nuts 81' and 83'.

Member 58' is positioned against member 48', wherein a line perpendicular to the planes of these two members passes through both slot 62' and bolt hole 55'. In addition, another line perpendicular to these two members passes through both slots 61' and 54', wherein slots 61' and 54' intersect. When member 58' is placed against member 48', portion 60' thereof fits between flanges 51' and 56', with the rear edge of portion 60' riding on the inside of flange 56' and the forward edge thereof riding on the inside of flange 51'.

Member 68' is placed against member 58' (or between member 48' and member 58' as shown in FIG. 3) so that slot 71' intersects slot 61', and slot 72' is aligned with slot 62'. Portion 70' also fits between flanges 51' and 56' so that the front edge of portion 70' rides against flange 51' and the rear edge thereof rides against flange 56'.

A bolt 84' is inserted through slots 71', 61', 54' and 44', and a nut 85' secures the bolt in place. Another bolt 86' is inserted through slots 72' and 62', hole 55' and slot 44', with a nut 87' securing the bolt in place.

With nuts 85' and 87' loosened, the lateral, relative position between members 58' and 68' can be selectively varied by moving the members in opposite directions along a line parallel to slots 62' and 72'. As the two members are moved in opposite directions, bolt 86' remains in a fixed position, since it is held in place by hole 55' in member 48'. Moreover, member 58' remains stationary relative to members 58' and 68'. Also as the two members are moved in opposite directions, bolt 84' remains fixed as far as its lateral position is concerned, but moves forward or rearward in slot 54'. It will then be seen that member 48' remains stationary and functions as the reference member from which all of members 40', 58' and 68' move. It will also be apparent that member 58' can be moved in a lateral direction with respect to member 68', and the movement will cause an equal and opposite movement of member 68' by reason of the action of bolt 84' in angled slots 61' and 71' . Thus when the rack is widened to accommodate wider printed circuit cards by moving members 58' and 68' outwardly in opposite directions, each side of the rack is widened by an equal distance from the reference slot 54'. Consequently the construction of the end assemblies of the rack enables automatic widening of each side of the rack by an equal amount, when one or both of the members 58' and 68' are moved. This enables the user to readily change the dimensions of the rack without the necessity of measuring the distance of extension of each side from the centerline. As one end assembly is changed, the other end assembly is also changed accordingly, since the two assemblies are connected through the secured channel members. It will then be apparent that the rack is symmetrically constructed.

Figure 5:
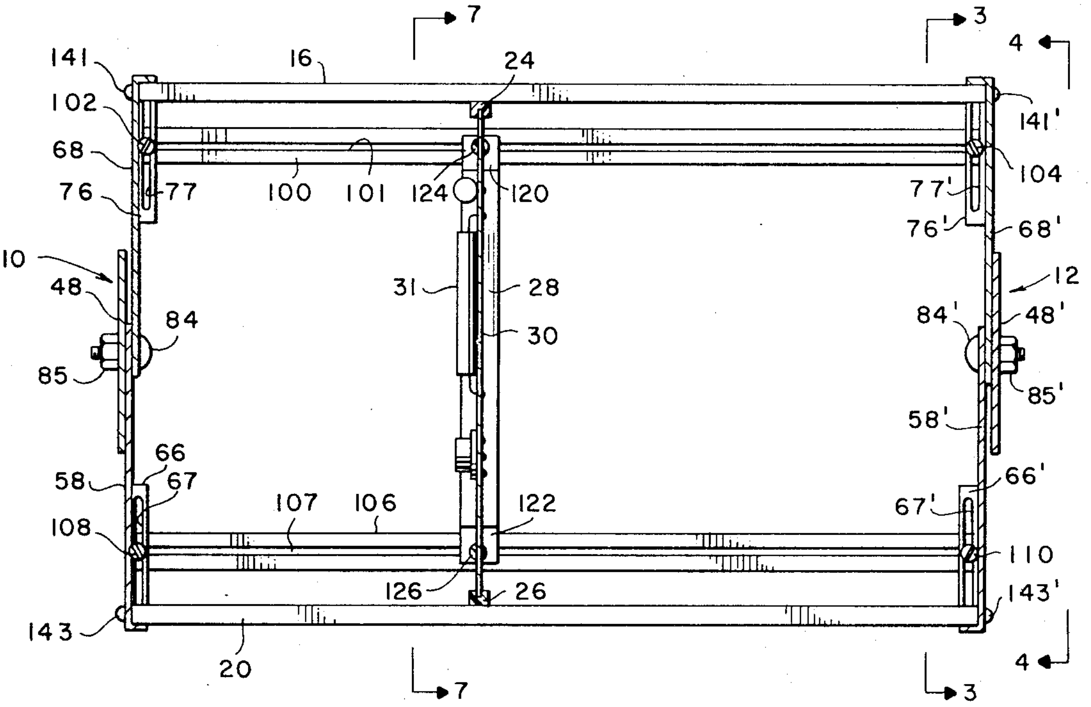
FIG. 5 is a front, section view of the rack shown in FIG. 1.
Figure 7:
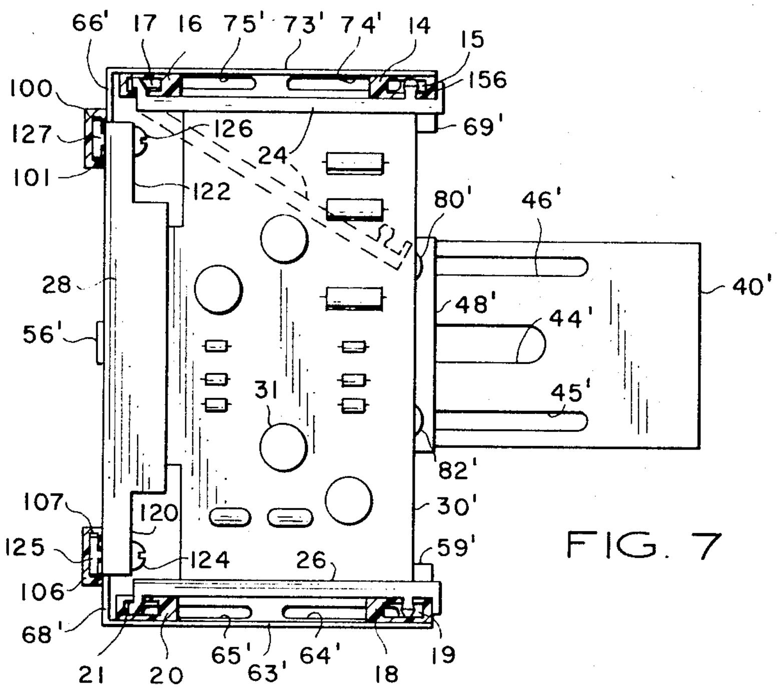
FIG. 7 is an end view, in section, taken through section lines 7—7 of FIG. 5.

FIG. 5 is a front section view of the rack shown in FIG. 1, taken along section lines 5—5 of FIG. 1. FIG. 7 is an end elevational view, taken through section lines 7—7 of FIG. 5. Referring to FIGS. 3, 5 and 7, and particularly to FIG. 5, additional channel members are shown for holding the circuit card connectors. A first channel member 100, having a channel 101 running the length thereof, is secured between end assemblies 10 and 12 at the top thereof adjacent one side of the rack. This channel member is secured at its opposite ends to flanges 76 and 76' of the two end assemblies by means of bolts 102 and 104, respectively. These bolts pass through slots 77 and 77' into the channel 101 and are secured by suitable nuts contained therein. For example, reference to FIG. 3 shows bolt 104 passing through the slot in flange 76' and being secured in place by a nut 103 that is contained within the channel 101 and prevented from turning therein. Similarly, another channel member 106, having a channel 107 running the length thereof, is secured between the two end assemblies by means of bolts 108 and 110 passing through slots 67 and 67' of flanges 66 and 66', respectively. These bolts have suitable nuts for securing the channel member in place, as seen in FIG. 3. Thus bolt 110 is screwed into nut 109, with the latter being contained within slot 107 of the channel member 106. These two channel members 100 and 106 are provided for holding electrical connectors, such as shown in FIGS. 5 and 7.

Referring to FIG. 7, the connector 28 spans the separation between channel members 100 and 106 and is secured between the two channel members by means of suitable bolts and nuts. The connector has a main body portion that terminates in shoulders 120 and 122 that rest on channel members 106 and 100, respectively. Bolt 124 is inserted through a hole (not shown) in shoulder 120 and mates with a suitable nut 125 contained within the channel 107. Similarly, bolt 126 is inserted through shoulder 122 that mates with a corresponding nut 127 contained within channel 101.

It will be seen that the distance of separation between channel members 100 and 106 can be selectively varied, by securing the channel members at different places along the slots 67, 67', and 77 and 77', of the end assemblies. This permits the accommodation of connectors of different widths. In addition, the connector itself can be positioned along any line between the two end assemblies, or a plurality of connectors can be secured within the space between the two end assemblies.

The channel members 14, 16, 18 and 20 are also secured between the two end assemblies as previously noted, by employing suitable bolts or screws. To effect this, the channels within these members terminate at points spaced from the ends thereof, so that the channel members are solid at the ends. Suitable threaded holes (not shown) are provided in the ends of the channel members to receive screws. Referring particularly to FIG. 4, channel member 14 is secured to portion 69' of member 68' by means of a screw 140 screwed through slot 74' into the end of the channel member 14. Likewise, channel member 16 is secured to portion 70' of member 68' by means of screw 141 screwed through slot 75' into the end of the channel member. Channel member 18 is secured in place by means of a screw 142 screwed through slot 64', and channel member 20 is secured by means of a screw 143 screwed through slot 65'. The other ends of these channel members are similarly secured to the other end assembly. It will be seen that the distance of separation between channel members 14 and 16 can be changed as desired, by securing the channel members along different points within the slots contained within the end assemblies. The same is true for the distance of separation between channel members 18 and 20.

The card guide or slide is shown in the perspective view of FIG. 6, and comprises an elongated main body portion 148 having a slot or channel 150 running the length thereof. The guide terminates at its front end in a flange 153 that overlaps the front edge of one of channel members 14 or 18. In addition, channel 150 opens in the front end of the guide for receiving one edge of the printed circuit card 30. To facilitate guiding the edge of the card into the channel 150, the channel is widened through beveled surfaces 151 and 152 at the front end of the guide. The guide includes a generally cylindrical split plug 156 formed integral therewith that projects from the outer edge in the same direction as does flange 153, but spaced therefrom. The plug comprises a pair of halves 154 and 155 separated by a slot cut therebetween. This plug can be inserted into the channel of the front channel member to secure the forward end of the card guide in place. When the plug is inserted within the channel, the two halves are urged together until they enter the channel, and then expand to hold the guide in place. The plug has a neck portion 157 to hold it within the channel. The rearward end of the card guide includes a foot 158 that projects inward and which is formed integral with the guide by means of a beveled portion 159 and a rearward projecting shoulder 160. This foot is for securing the other end of the card guide within the channel of the rear channel member.

Referring again to FIG. 7, the card guides 24 and 26 are shown secured in place in their respective channel members, in addition to which card guide 24 is shown in phantom to illustrate how it is assembled. To connect card guide 24 in place, for example, the foot 158 at the rearward end thereof is inserted within the channel 17 in member 16 by angling the card guide away from channel member 14. After the foot has been inserted within the channel in member 16, the guide is then forced or rotated toward channel member 14 until the plug has been inserted within the channel member 14. The guide 26 is similarly installed within the channels of members 18 and 20. The connector 28 is connected to its channel members so that it is in alignment with the slots provided within the card guides. Thereafter, the printed circuit card 30 is inserted along its two edges within the slots provided in the card guides and urged rearward until the male connector portions thereof (not shown) are mated with the female connector 28.

For convenience in aligning card guides 24 and 26, suitable indices 200 may be placed on channel members 14 and 18 as shown in FIG. 1. These indices may take any conventional form, such as grooves, marks, dots, or numerals positioned at evenly spaced intervals along an exposed surface channel members. Such indices are conventionally used to align the end flange portion 153 at the ends of the card guides 24 and 26 and place the card guides in coplanar positions. Likewise, suitable indices may be placed on channel members 16 and 20 for aligning the opposite ends of the card guides.

From the foregoing it will be observed that the principles of this invention may be advantageously used to provide a printed circuit card rack which may readily be adjustably expanded or contracted in dimensions along the X-, Y- or Z-axis thereof to accommodate various sizes of circuit cards.

It is to be understood that although the invention has been described with particular reference to specific embodiments thereof, the form of the invention shown and described in detail is to be taken as the preferred embodiment of same, and that various changes and modifications may be resorted to without departing from the spirit and scope of the invention as defined by the appended claims.

What is claimed is:

1. A rack for holding printed circuit cards comprising:

a. a first end assembly having first and second members adjustably coupled together so that the relative position of said first member with respect to said second member is selectively variable, b. a second end assembly having third and fourth members adjustably coupled together so that the relative position of said third member with respect to said fourth member is selectively variable, and c. fifth and sixth spaced-apart members connected between and separating said first and said second end assemblies for holding a circuit card therebetween, in which the distance between said fifth and sixth members is varied when the relative positions of said first and said second members and of said third and said fourth members are varied.

2. A rack as set forth in claim 1 wherein said first and said second end assemblies include seventh and eighth members, respectively, for attaching said rack to a panel.

3. A rack as set forth in claim 2 wherein said seventh member is adjustably connected to said first and said second members so that the position thereof is selectively variable relative to said first and said second members, and said eighth member is adjustably connected to said third and said fourth members so that the position thereof is selectively variable relative to said third and said fourth members.

4. A rack as set forth in claim 1 wherein said fifth member is connected between said first and said third members, and said sixth member is connected between said second and said fourth members; wherein said first end assembly includes a seventh member to which said first and said second members are adjustably connected so that movement of one of said first and said second members relative to said seventh member causes an opposite movement of equal distance of the other of said first and said second members relative to said seventh member, and said second end assembly includes an eighth member to which said third and said fourth members are adjustably connected so that movement of one of said third and said fourth members relative to said eighth member causes an opposite movement of equal distance of the other of said third and said fourth members relative to said eighth member.

5. A rack for holding printed circuit cards comprising:

a. a supporting frame comprising at least four elongated substantially parallel frame members, b. a pair of end assemblies for interconnecting the ends of said frame disposed at opposite ends of said parallel frame members, each of said end assemblies including:

i. a first substantially rectangular member having first, second and third elongated substantially parallel slots therein, ii. a second substantially rectangular member having first, second and third substantially parallel slots therein, said first, second and third slots in said second members extending in substantially coplanar relationship with said first, second and third slots in said first member, said second member further including first and second substantially parallel flange portions extending from one surface thereof and parallel to said slots, and third and fourth substantially parallel flange portions extend from the opposite surface thereof and normal to said slots, iii. a third member having a first flange portion extending from a first edge thereof and substantially parallel to said slots, said third member also having a pair of slots therein adjacent said first edge, a second slotted flange extending from a second intersecting edge thereof, a third slot therein substantially parallel to said slotted flange, and a fourth slot extending diagonally across the face thereof, iv. a fourth member comprising a substantially reversed and inverted mirror image of said third member, and v. connecting means for interconnecting said first, second, third and fourth members, c. means for securing one end of each of two of said elongated frame members with said third end assembly member in one of said end assemblies and the opposite ends of said elongated frame members with said third end assembly member in the other end assembly, and d. means for securing one end of each of two of said elongated frame members with said fourth end assembly member in one of said end assemblies and the opposite ends of said elongated frame members with said fourth end assembly member in the other end assembly.

6. The rack defined in claim 5 wherein each of said frame members includes a channel extending along substantially the full length of one face thereof.

7. The rack defined in claim 5 and further having a pair of substantially parallel connector support members one of which is secured between the slotted flanged portions of said third members in each of said end assemblies and the other of which is secured between said slotted flanged portions of said fourth members in each of said end assemblies.

8. The rack defined in claim 7 and further having an electrical connector for receiving the electrical connection portion of a printed circuit card attached to and between said pair of connector support members.

9. The rack defined in claim 5 and including at least one card guide supported by two of said substantially parallel frame members.

10. The rack defined in claim 6 and including at least one card guide supported by two of said substantially parallel frame members, said card guide comprising an elongated body having a channel extending along one surface thereof and attaching means extending from the opposite surface thereof and adapted to mate with the channels in said frame members, thereby to detachably secure said card guide to said frame members.

11. The rack defined in claim 5 wherein said first member in each of said end assemblies has a flange portion extending from one end thereof for attaching said rack to a panel.

* * * * *